US010644649B2

(12) United States Patent
Kastan Dahl

(10) Patent No.: US 10,644,649 B2
(45) Date of Patent: May 5, 2020

(54) OSCILLATING FREQUENCY WAVE GRID GENERATOR

(71) Applicant: Chromodynamics II LLC, East Hampton, NY (US)

(72) Inventor: Renee Marion Kastan Dahl, East Hampton, NY (US)

(73) Assignee: Chromodynamics II LLC, East Hampton, NY (US)

( * ) Notice: Subject to any disclaimer, the term of this patent is extended or adjusted under 35 U.S.C. 154(b) by 0 days.

(21) Appl. No.: 16/005,062

(22) Filed: Jun. 11, 2018

(65) Prior Publication Data

US 2018/0358927 A1 Dec. 13, 2018

Related U.S. Application Data

(60) Provisional application No. 62/517,667, filed on Jun. 9, 2017.

(51) Int. Cl.
| | | |
|---|---|---|
| *H03B 5/32* | (2006.01) |
| *H03B 19/03* | (2006.01) |
| *H03B 28/00* | (2006.01) |
| *H03H 9/02* | (2006.01) |
| *H03B 5/18* | (2006.01) |
| *G10K 11/178* | (2006.01) |

(52) U.S. Cl.
CPC ............ *H03B 5/326* (2013.01); *G10K 11/178* (2013.01); *H03B 5/18* (2013.01); *H03B 19/03* (2013.01); *H03B 28/00* (2013.01); *H03H 9/02244* (2013.01); *H03B 2201/02* (2013.01)

(58) Field of Classification Search
CPC ........................................................ H03B 5/326
USPC ..................................................... 331/107 R
See application file for complete search history.

(56) References Cited

U.S. PATENT DOCUMENTS 3,653,046 A * 3/1972 Glance .................... H01Q 3/42
342/371

* cited by examiner

*Primary Examiner* — Joseph Chang
(74) *Attorney, Agent, or Firm* — Dunlap Bennett & Ludwig PLLC; Brendan E. Squire

(57) ABSTRACT

An acoustic wave force field generator array that uses a plurality of synchronized oscillating emitters system that effectively blocks noise from passing through an acoustic barrier of wave/bubble pattern forms generated by the rapid oscillation of the integrated magnet and emitter system. The movement of the magnets also produces an EM field that generates a current to at least partially power the driver and speaker systems.

10 Claims, 11 Drawing Sheets

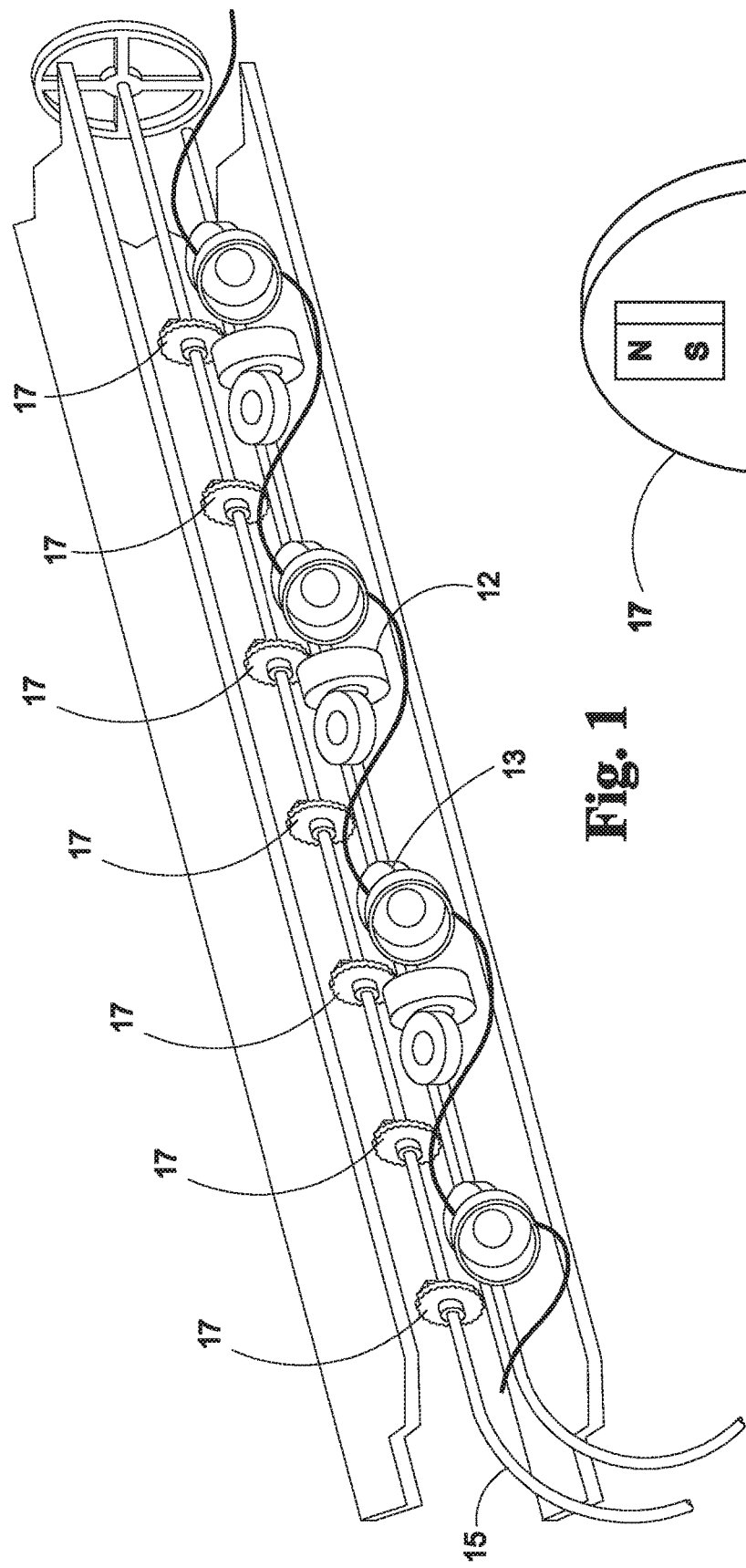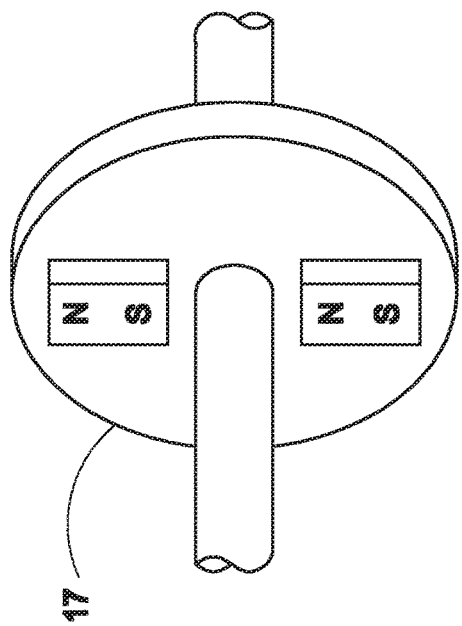
Fig. 1
Fig. 1a

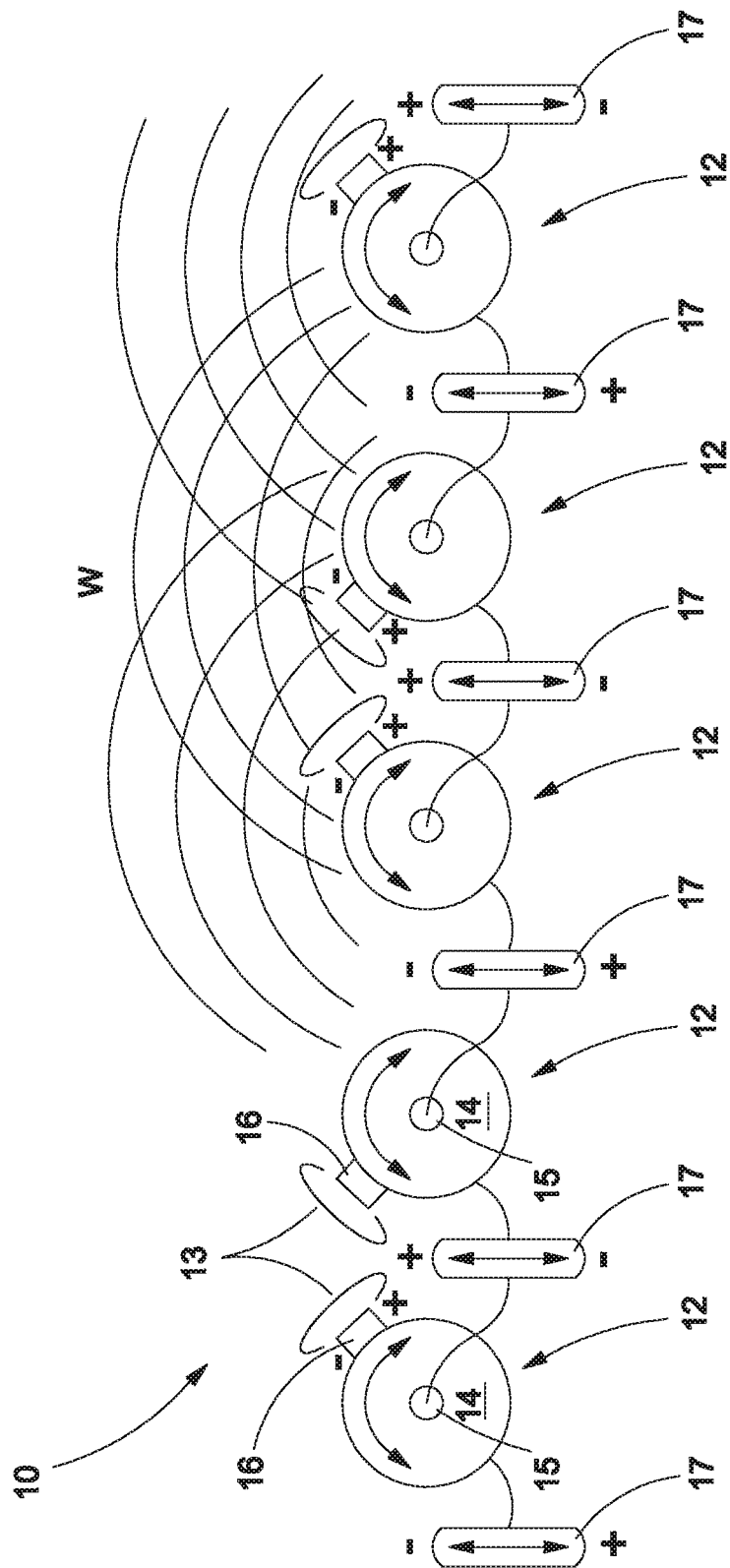

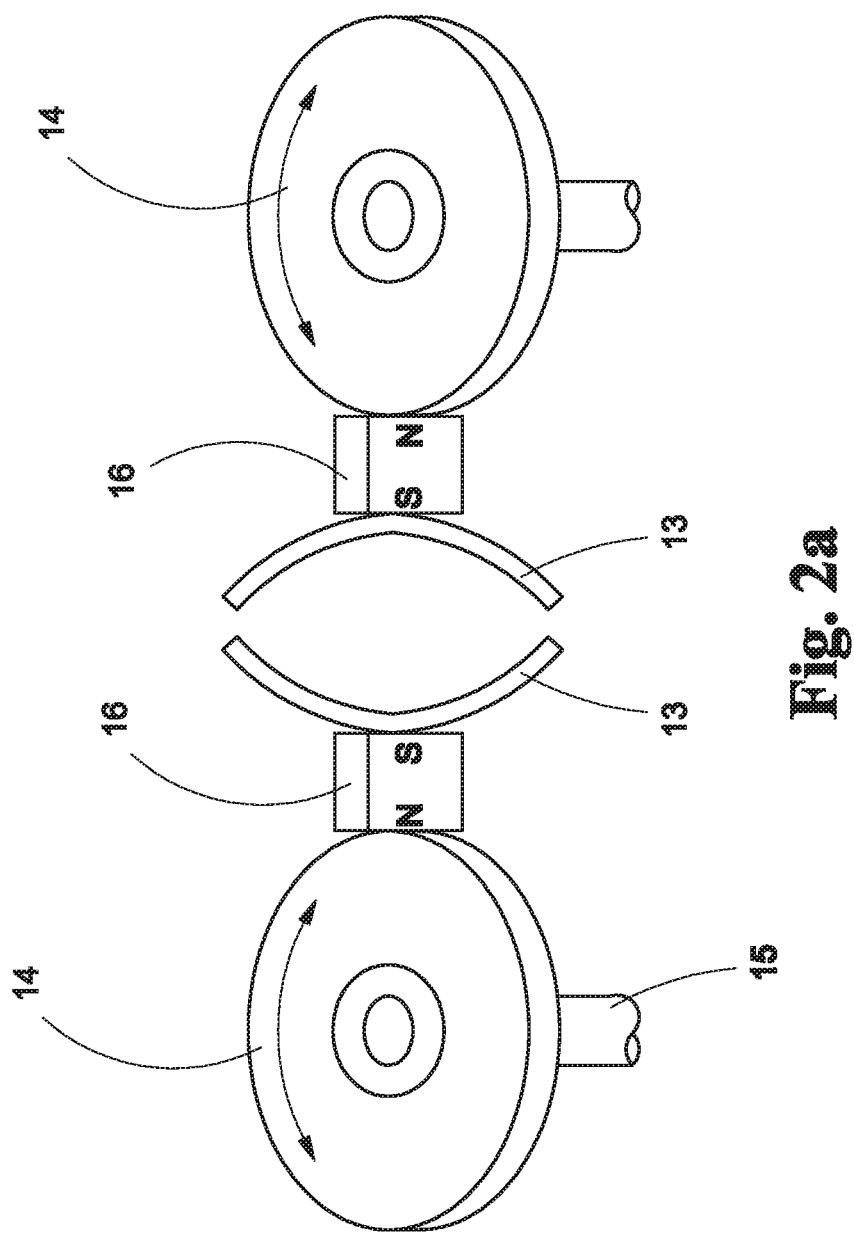

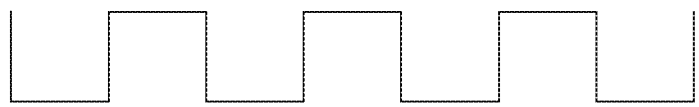
Fig. 6a
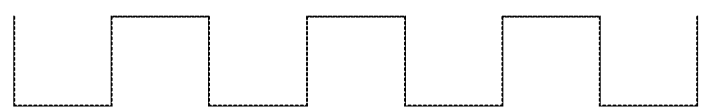
Fig. 6b
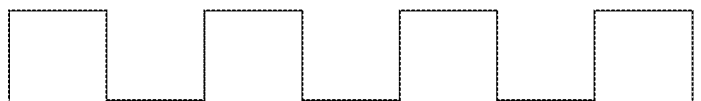
Fig. 6c

OSCILLATING FREQUENCY WAVE GRID GENERATOR

CROSS-REFERENCE TO RELATED APPLICATION

This application claims the benefit of priority of U.S. provisional application No. 62/517,667, filed Jun. 9, 2017, the contents of which are herein incorporated by reference.

BACKGROUND OF THE INVENTION

The present invention relates to frequency wave generators, and more particularly to oscillating frequency wave grid generators.

In our current connected society, we are constantly bombarded by various energy waves. Traditionally, these intrusions were primarily limited to sound waves from busy highway traffic, congested city streets, manufacturing facilities, and the like. Traffic and landscaping noise continue to be a problem and by using ultra low and/or ultra high frequencies these noise problems can be mitigated and/or entirely eliminated by the Acoustic Force field created by the Oscillating Frequency Wave Grid Generator.

In our increasingly connected society, the increasing intrusion of radio frequency (RF) waves from cellular infrastructure, wireless networking, and power lines and other emissions are becoming increasingly ubiquitous. Likewise, light continues to increasingly penetrate the darkness of the world.

All of these can disturb tranquility for individuals to sleep, rest, or relax. Ever increasing exposures to these emissions may also have deleterious health effects for people and the environment.

As can be seen, there is a need for an apparatus and method for blocking undesirable energy waves for restoring tranquility.

SUMMARY OF THE INVENTION

In one aspect of the present invention an oscillatory wave field generator having a plurality of oscillators disposed in a spaced apart relation to define an array. An emitter is carried on each of the plurality of oscillators. A synchronizer coordinates the orientation of the plurality of oscillators to generate an emitted wave field in front of the oscillatory wave field generator.

In some embodiments, the plurality of oscillators include a non-magnetic body rotationally disposed about a shaft. A fixed magnet is carried on each non-magnetic body in a polar orientation, wherein the fixed magnet carried on an adjacent magnetic oscillator is in polar opposition.

In some embodiments, the synchronizer includes a plurality of spaced apart motive magnets rotationally disposed about each of the plurality of oscillators in an axis orthogonal to a rotational axis the plurality of oscillators. A motive shaft may interconnect the plurality of motive magnets. An inductor may be carried on each of the plurality of oscillators, wherein a conductor interconnects one or more of the inductors.

In yet other embodiments, the oscillatory wave field generator includes signal generator to develop one or more emission signals for each emitter.

The emitter may be selected for the desired embodiment. The emitter may be an audio emitter. The emitter may alternatively be a laser. In yet other embodiments, the emitter may be an RF antenna.

These and other features, aspects and advantages of the present invention will become better understood with reference to the following drawings, description and claims.

BRIEF DESCRIPTION OF THE DRAWINGS

FIG. 1 illustrates a front perspective view of an embodiment of an oscillatory wave field generator array.

FIG. 1a is a detail view of a motive magnet.

FIG. 2 illustrates a top plan view of the oscillatory wave field generator array.

FIG. 2a is a detail view of an oscillator.

FIGS. 6a-f illustrate various patterns for the arrangement of the array "strings".

DETAILED DESCRIPTION OF THE INVENTION

Figure 4:
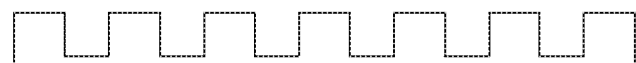
FIG. 4 illustrates a pattern for the arrangement of the array "strings".

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Broadly, embodiments of the present invention provide an oscillatory wave field generator array to block the passage countervailing wave field. As seen in reference to FIG. 1, the oscillatory wave field generator array 10 includes a plurality of oscillators 12 disposed in an array to orient an emitter 13 carried by each of the plurality of oscillators 12 in a synchronized path to generate an emitted wave field W. In the non-limiting embodiment shown, the emitter 13 may be a speaker or a sonic laser (SASER) to emit sound waves. In other embodiments, the emitter 13 may also be a radio frequency emitter RF, a light optical emitter, such as a light emitting diode LED, a LASER, or the like.

In the simplified embodiment shown, the plurality of oscillators 12 may include a non-magnetic body 14 rotationally disposed about a shaft 15. A fixed magnet 16 may be disposed at an edge of the non-magnetic body 14. The plurality of oscillators are disposed between a plurality of spaced apart motive magnets 17. The polarity of each of the motive magnets 17 alternates 180 degrees opposed from that of a preceding motive magnet 17. Likewise, the polarity of the fixed magnets 16 alternates for each of the plurality of oscillators 12. The plurality of motive magnets 17 may be rotationally carried on a shaft interconnecting the motive magnets 16. Preferably the fixed magnet 16 and the motive magnets 17 are high strength neodymium magnets.

In the embodiment shown, the plurality of oscillators 12 are configured to move in a synchronized manner with a motive force provided by the motive magnets 17 as they are rotated about the interconnecting shaft. The interconnecting shaft may be a fixed shaft or a flex shaft to arrange the array as an arranged pattern, much like a string light. As a positive pole of the motive magnet 17 approaches the positive poles of the respective adjacent fixed magnets 16, carried by the oscillators 12, the fixed magnets 16 are repulsed by the positive magnetic field. The bodies 14 then rotate about the shaft 15 so that the emitter 13 is swept in an arc.

As the negative poles of the fixed magnets 16 approach the negative poles of the motive magnets 17, the negative magnetic poles will repulse the fixed magnets 16 in the opposite direction so that the emitter 13 is swept in a reverse arc. As will be appreciated based on the present disclosure, the opposed alternating polarities of the fixed magnets 16 and the motive magnets 17 result in a self synchronization of the oscillators 12 with the rotation of the motive magnets 17 about their common shaft 18. Utilizing the repulsion of the magnets the motive magnets 17 rotate orthogonally to the fixed magnets 16 to keep the oscillators 12 from reaching a magnetic equilibrium and stopping. The motive magnets 17 may be rotated at a rate to obtain the desired blocking wave for blocking the countervailing intrusive wave.

The energy imparted to the oscillating bodies 14 of the oscillators 12 by the motive magnets 17 may be harnessed by an inductor integrated with each of the oscillating bodies 14. The inductors may be interconnected with a conductor to at least partially power the emitters 12, a signal generator (not shown) for the emitter, and a motor for the motive magnets 17.

In a first non-limiting embodiment, the individual emitters 13 may be audio signal transmitters, such as a wireless speaker to produce the frequency desired for a frequency grid layer created as a countervailing force to an intrusive sound wave. The frequency grid layer serve to block out or dampen incoming intrusive noise. As indicated, both the speed and frequency emitted are entirely variable and each emitter 13 can be set at its own frequencies. While the frequencies may be varied, for audio applications, the low to ultra-low frequencies in the range of 50-100 Hz may be most effective.

Figure 3:
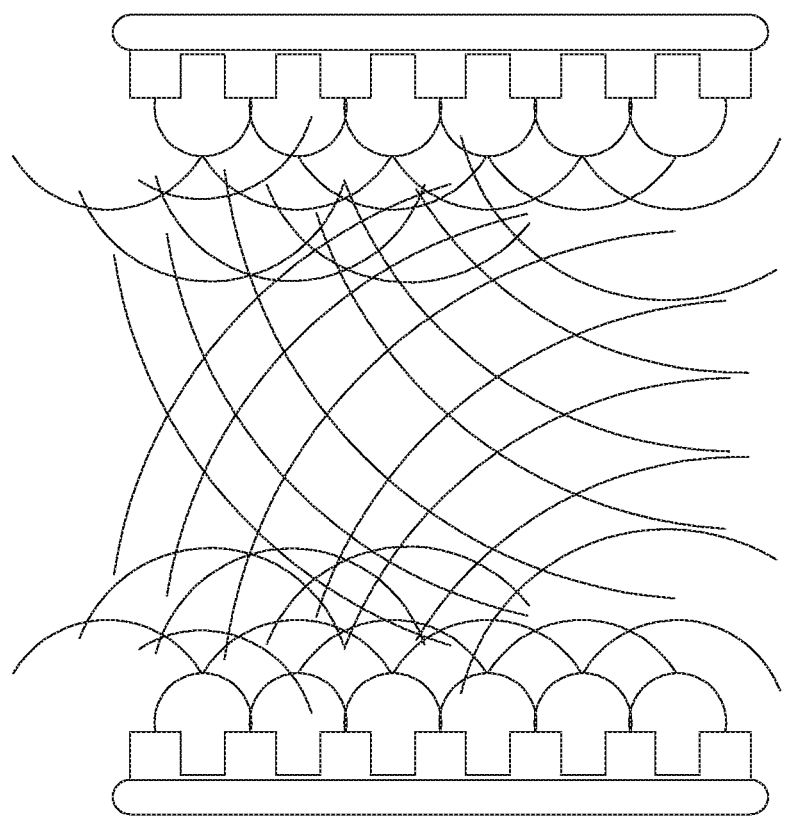
FIG. 3 illustrates a wave force field between opposed wave generator arrays as a possible arrangement of generator array strings.
Figure 5A:
FIGS. 5a-5h illustrate various patterns for the arrangement of the array "strings".
Figure 5B:
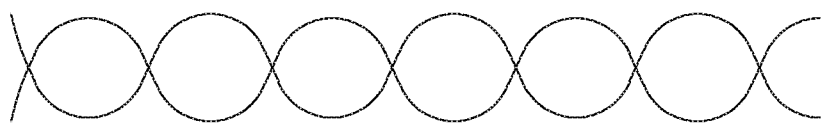
Figure 5C:
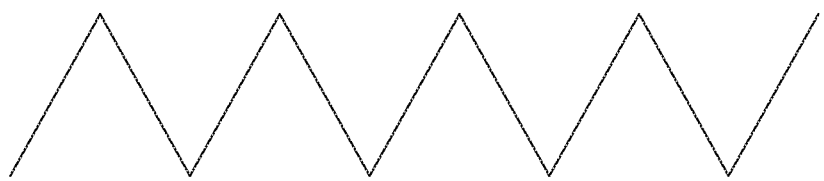
Figure 5D:
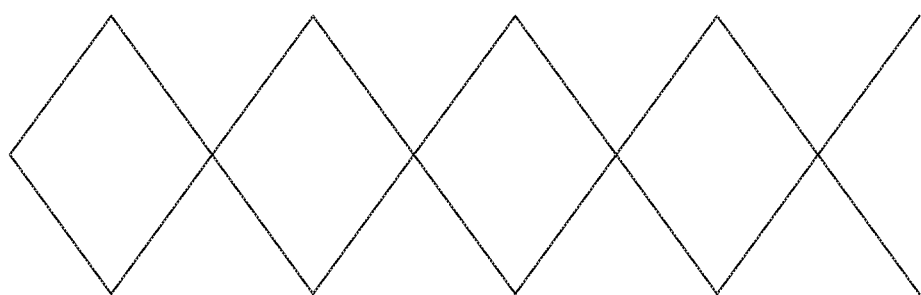
Figure 5E:
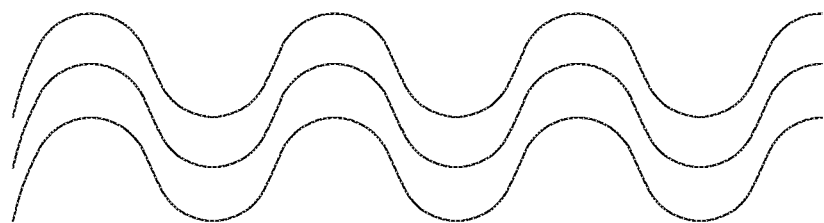
Figure 5F:
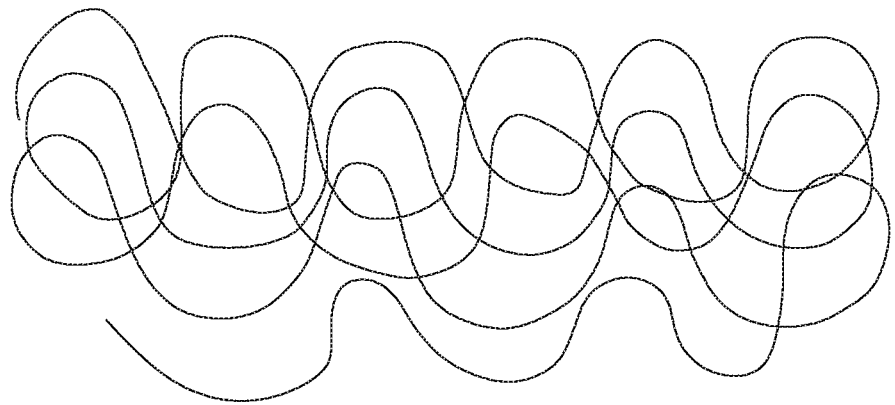
Figure 5G:
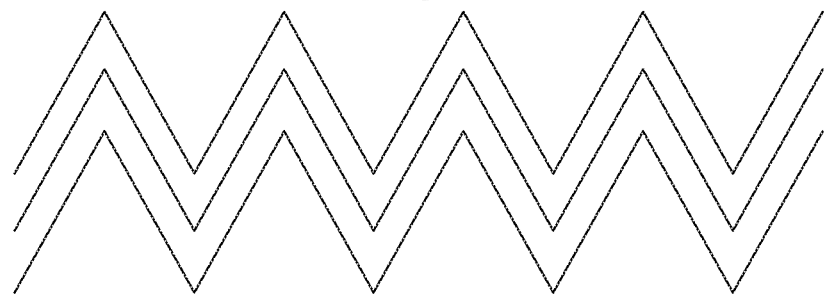
Figure 5H:
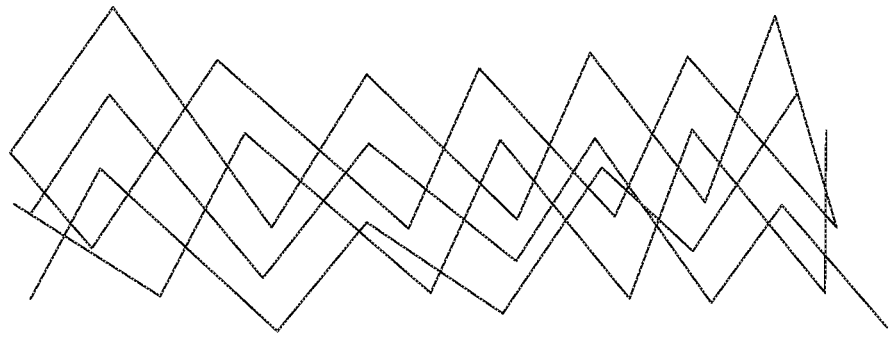
Figure 6D:
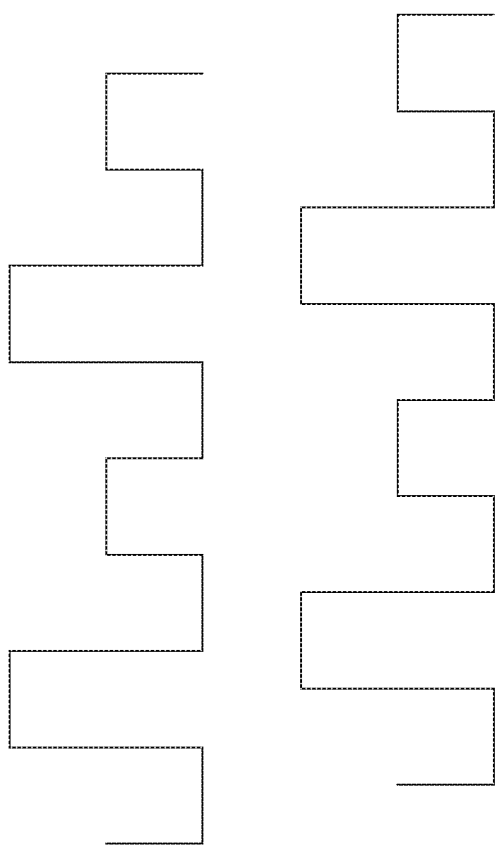
Figure 6F:
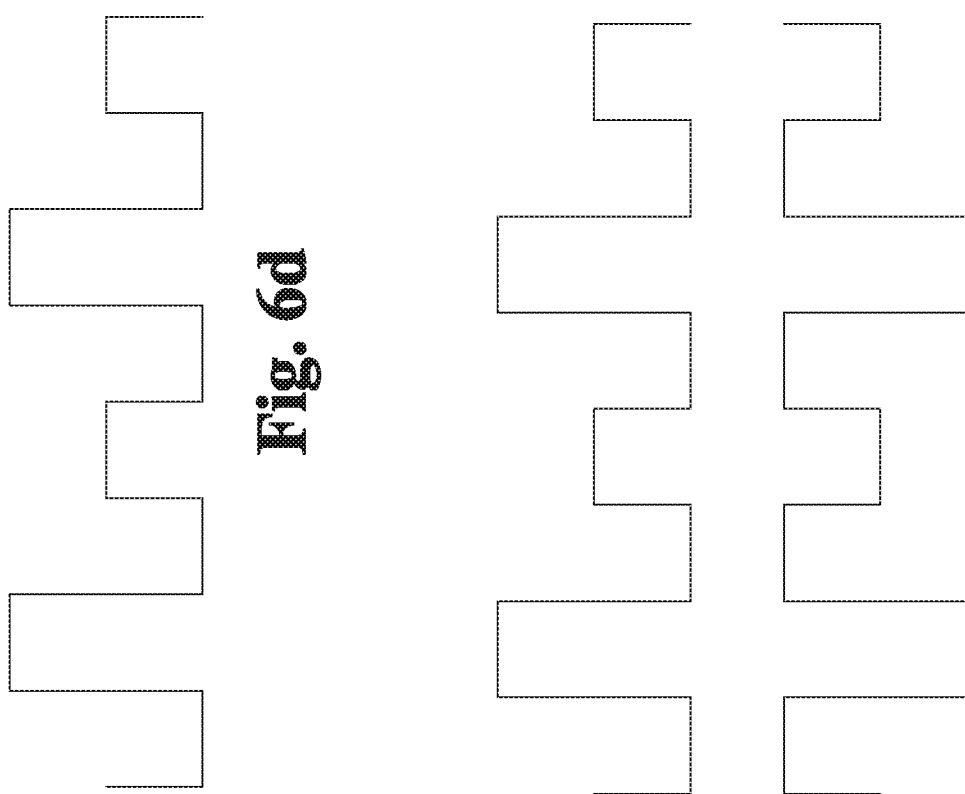
Figure 6E:
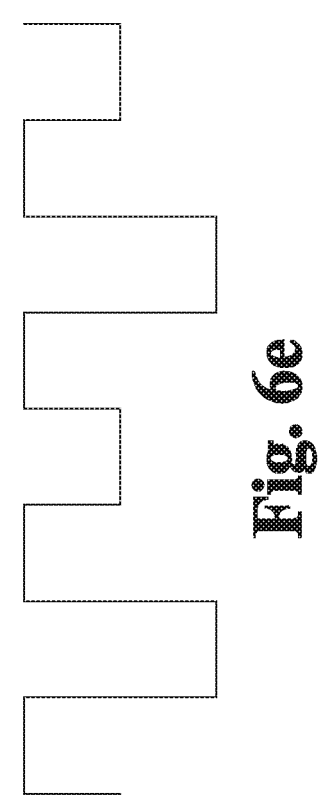
Figure 7:
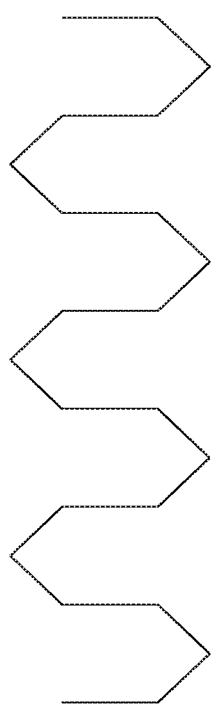
FIG. 7 illustrates patterns for the arrangement of the array "strings". wave
Figure 8:
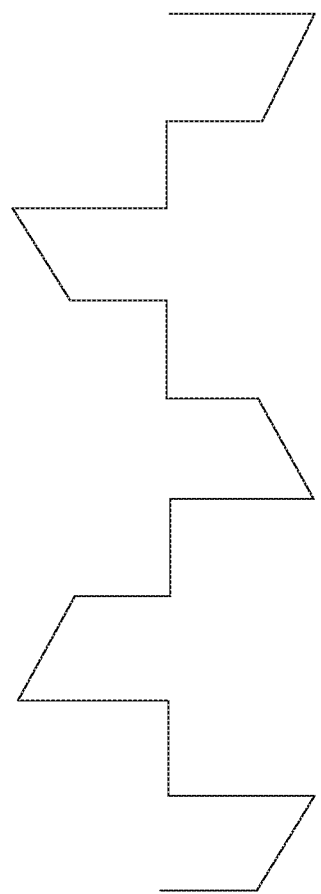
FIG. 8 illustrates patterns for the arrangement of the array "strings".
Figure 9:
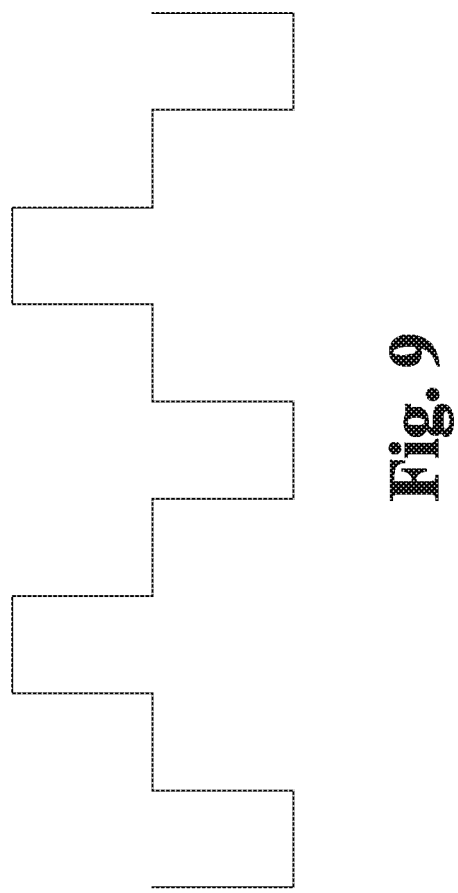
FIG. 9 illustrates patterns for the arrangement of the array "strings".
Figure 10:
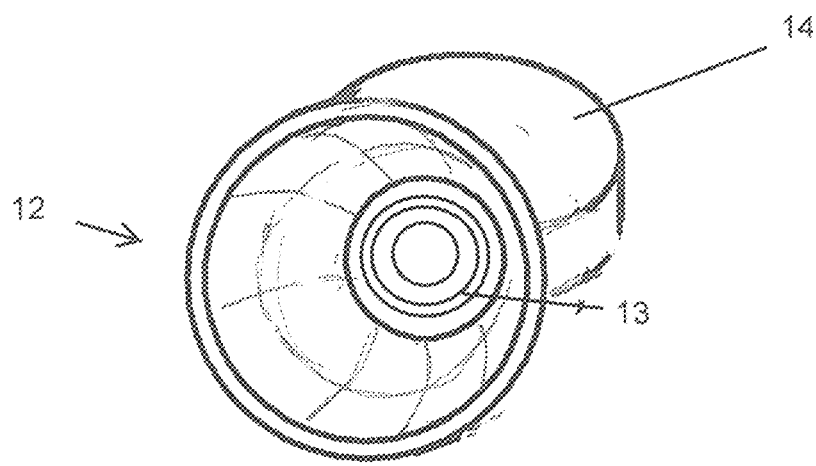
FIG. 10 is a perspective view of an oscillator with an audio emitter.
Figure 11:
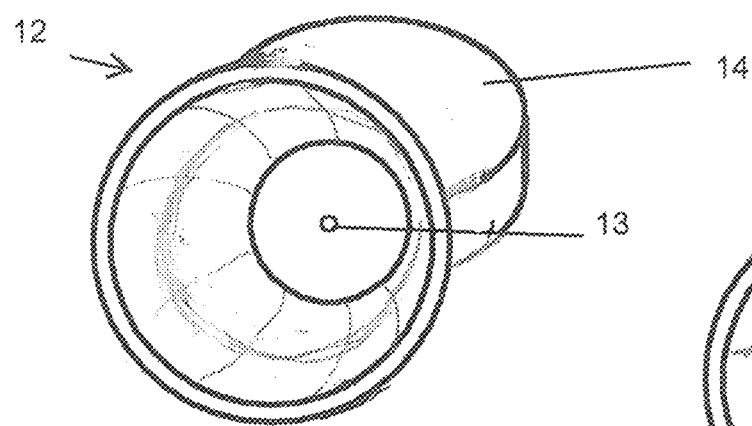
FIG. 11 is a perspective view of an oscillator with a laser emitter.
Figure 12:
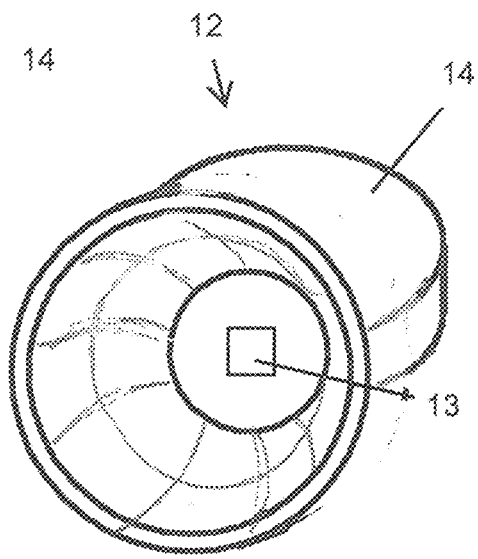
FIG. 12 is a perspective view of an oscillator with a MEMS emitter.

As seen in reference to the drawings of FIGS. 3-9, the blocking of incoming sound may achieved by the use of inaudible, or barely audible sound and the currents created by the motion of the intricacies of sound as made visible through cymatics, which allows us to re-visualize and better understand the complex structure of sound itself. The sound/frequency currents developed by the oscillatory wave field generator array 10 of the present invention interweave and create interference patterns that block all other sound that comes in contact with it, effectively breaking up the patterns/waves of the intrusive noise and rendering it mute. The unwanted sound waves are broken up and their form destroyed as their energy is dissipated/and or absorbed by the created force field as they hit the frequency grid created by the oscillatory wave field generator array 10.

The oscillatory wave field generator 10 of the present invention may be employed as a "sound fence" around the perimeter of a property. In this matter it may be incorporated with an existing wall, fence, or other boundary structure to provide a protective emitted wave field W to protect the home owner from intrusive sounds. In some embodiments the oscillatory wave field generator 10 may be formed in a smaller unit, such as for a window sill for an apartment or other dwelling to provide a sound barrier from the intrusion of exterior street sounds.

In other embodiments, the array 10 of emitting oscillators 12 can be arranged any number of ways. With the emitter 13 configured as an antenna, an RF cavity may be formed to trap and dissipate the unwanted RF signals (noise), such as shown in reference to FIG. 7. A control circuit may provide the synchronization of the oscillators 12 and emitters 13 to develop the emitted wave field W. As seen schematically, in FIG. 8, the arrays 10 can also be mounted perpendicularly to the ground, utilizing multiple sources to strengthen the damping field. In yet other embodiments, a laser emitter 13, may be carried on an oscillator 12 formed with a microelectromechanical systems (MEMS) structure to block an intrusive light source. A control circuit may provide synchronization for the oscillator 12 and laser emitter 13.

It should be understood, of course, that the foregoing relates to exemplary embodiments of the invention and that modifications may be made without departing from the spirit and scope of the invention as set forth in the following claims.

What is claimed is:

1. An oscillatory wave field generator, comprising:
   a plurality of oscillators disposed in a spaced apart relation to define an array;
   an emitter carried on each of the plurality of oscillators, each of the emitters adapted to emit a signal from a signal generator;
   wherein the orientation of the plurality of oscillators is magnetically synchronized to generate an emitted wave field in front of the oscillatory wave field generator.

2. The oscillatory wave field generator of claim 1, wherein the plurality of oscillators further comprise:
   a non-magnetic body rotationally disposed about a shaft; and
   a fixed magnet carried on each non-magnetic body in a polar orientation, wherein the fixed magnet carried on an adjacent magnetic oscillator is in polar opposition.

3. The oscillatory wave field generator of claim 2, further comprising:
   a plurality of spaced apart motive magnets rotationally disposed about each of the plurality of oscillators in an axis orthogonal to a rotational axis the plurality of oscillators.

4. The oscillatory wave field generator of claim 3, further comprising:
   a motive shaft interconnecting the plurality of motive magnets.

5. The oscillatory wave field generator of claim 4, further comprising:
   an inductor carried on each of the plurality of oscillators, wherein a conductor interconnects one or more of the inductors.

6. The oscillatory wave field generator of claim 1, further comprising;
   a signal generator to develop one or more emission signals for each emitter.

7. The oscillatory wave field generator of claim 1, wherein the emitter is an audio emitter.

8. The oscillatory wave field generator of claim 1, wherein the emitter is a laser.

9. The oscillatory wave field generator of claim 7, wherein the plurality of oscillators further comprise a microelectromechanical systems (MEMS) structure.

10. The oscillatory wave field generator of claim 1, wherein the emitter is an RF antenna.

\* \* \* \* \*